United States Patent [19]

Girmay

[11] Patent Number: 5,379,321
[45] Date of Patent: Jan. 3, 1995

[54] HIGH SPEED PWM WITHOUT LINEARITY COMPROMISE AT EXTREME DUTY CYCLES

[75] Inventor: Girmay K. Girmay, Mirada, Calif.

[73] Assignee: Xerox Corporation, Stamford, Conn.

[21] Appl. No.: 966,912

[22] Filed: Feb. 1, 1993

[51] Int. Cl.⁶ .............................................. H03K 9/08
[52] U.S. Cl. ......................................... 375/22; 375/76; 370/9; 327/172; 327/175
[58] Field of Search ..................... 375/22–24, 375/76; 370/8–10; 329/112; 332/109; 307/260–268; 340/870.23, 870.24

[56] References Cited

U.S. PATENT DOCUMENTS

| | | | |
|---|---|---|---|
| 3,840,890 | 10/1974 | Sunderland | 375/22 |
| 4,333,108 | 6/1982 | Quan et al. | 375/22 |
| 4,669,089 | 5/1987 | Gahagan et al. | 375/22 |
| 5,198,785 | 3/1993 | Jordan | 375/22 |
| 5,208,559 | 5/1993 | Jordan | 375/22 |

Primary Examiner—Stephen Chin
Assistant Examiner—Young Tse
Attorney, Agent, or Firm—Robert E. Cunha

[57] ABSTRACT

A circuit for reducing the amount of instability in a pulse width modualtion circuit by providing a minimum amount of overdrive after the crossover point between a ramp and a voltage threshold level, and a constant amount of discharge time between the end on one ramp and the beginning of the next. Also, a feedback loop is privided to increase or decrease the slope to compensate for a decreasing or increasing amount of time between clock pulses, to maintain the duty cycle of the output when the clock frequency varies.

1 Claim, 5 Drawing Sheets

HIGH SPEED PWM WITHOUT LINEARITY COMPROMISE AT EXTREME DUTY CYCLES

BACKGROUND OF THE INVENTION

A circuit for generating pulse width modulated (PWM) pulses accurately by having ramp and discharge times that are constant regardless of the PWM timing of the output, and a feedback loop to maintain the duty cycle over a range of clock frequencies.

A PWM circuit normally compares a ramp waveshape having a constant slope against a variable threshold DC level to produce an output pulse that toggles at the point where the ramp level exceeds the threshold level. Also, as soon as the threshold level is reached, the ramp is discharged to zero. For long output pulses in relatively high speed circuits, the time for the ramp circuit to discharge is short, and any variability in the ramp slope or threshold voltage results in a variation in this discharge time, which in turn, affects the timing of the next cycle. Thus, the variability of the discharge time of the circuit results in significant PWM tolerances that make it unusable in high speed precision applications such as the modulation of video data.

Also, the ramp waveshape actually has to go a bit past the threshold level for the comparator to be able to react to it. This additional amount of drive is called "overdrive", and the comparator output delay is highly influenced by the amount of this overdrive at its input. Overdrive less than a certain minimum value results in more delay between the time of the crossover point and the fall time of the output pulse. In current designs this amount is not controlled, thereby resulting in inconsistent widths for the same threshold levels. However, due to the over-all period mandated by some design requirements (such as for switching power supply applications) the variabilities of the device delays are considered insignificant. However, an uncontrolled amount of overdrive can result in timing tolerances that are unacceptable, especially in applications where these uncertainties are significant as compared to the over-all period of the data being modulated.

A third problem that a PWM circuit must deal with is that of a changing clock frequency. If the output pulse ON time is fixed and the clock frequency changes, the OFF time, and therefore the duty cycle, also changes. Fourth, if the ramp is discharged at the crossover point, the circuit can only be used to generate one output pulse train. Finally, the circuit must be as simple, and use as few parts, as possible.

SUMMARY OF THE INVENTION

This circuit solves these problems by establishing a fixed ramp which is longer by a predetermined amount than the longest ramp required to produce the highest duty cycle, and a fixed discharge time. This gives the circuit a guaranteed minimum amount of overdrive and a constant discharge time which results in a more stable output. Also, since the ramp circuit is not discharged when the ramp exceeds the threshold, this circuit can produce any number of output pulse trains from one ramp. In addition, a feedback loop is provided to vary the ramp slope to maintain a constant duty cycle output for a given threshold as the clock frequency varies. Finally, the circuit is simple and uses few parts.

DETAILED DESCRIPTION OF THE INVENTION

Figure 1:
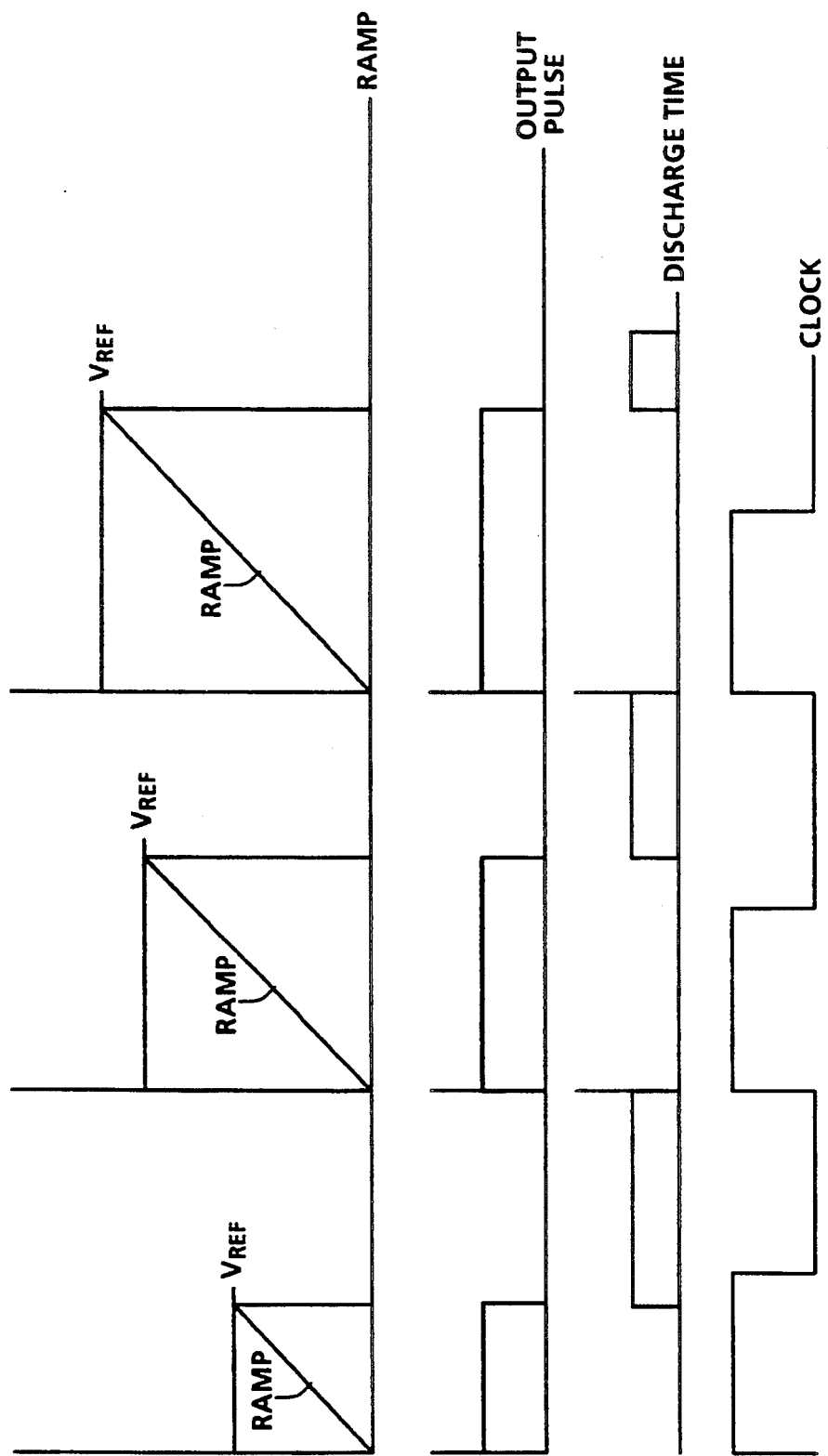
FIG. 1 is a timing diagram of a prior art PWM circuit.

FIG. 1 shows the waveshapes of short, medium and long output pulses of a typical PWM circuit. A digital to analog converter (DAC) or other equivalent means may be used to generate the variable threshold, VREF, which is compared against a ramp having a constant slope. The output pulse is ON until the two voltages meet, and OFF for the remainder of the cycle, during which time the circuit discharges.

After the threshold point is reached, the ramp continues for a short and uncontrolled distance, not shown, defined here as "overdrive", and from this crossover point to the beginning of the next cycle, the circuit will discharge and remain discharged. The amount of overdrive affects the circuit delay and uncertainty, the smaller the overdrive the greater the uncertainty. The variable amount of discharge time also contributes to the uncertainty. The worst case is the generation of the longest output waveshape which results in the shortest discharge time, the least amount of overdrive and the greatest instability. The result is that this approach is un-usable for any application where the duration of the entire cycle is not significantly longer that the time it takes for the ramp to reach the threshold.

Figure 2:
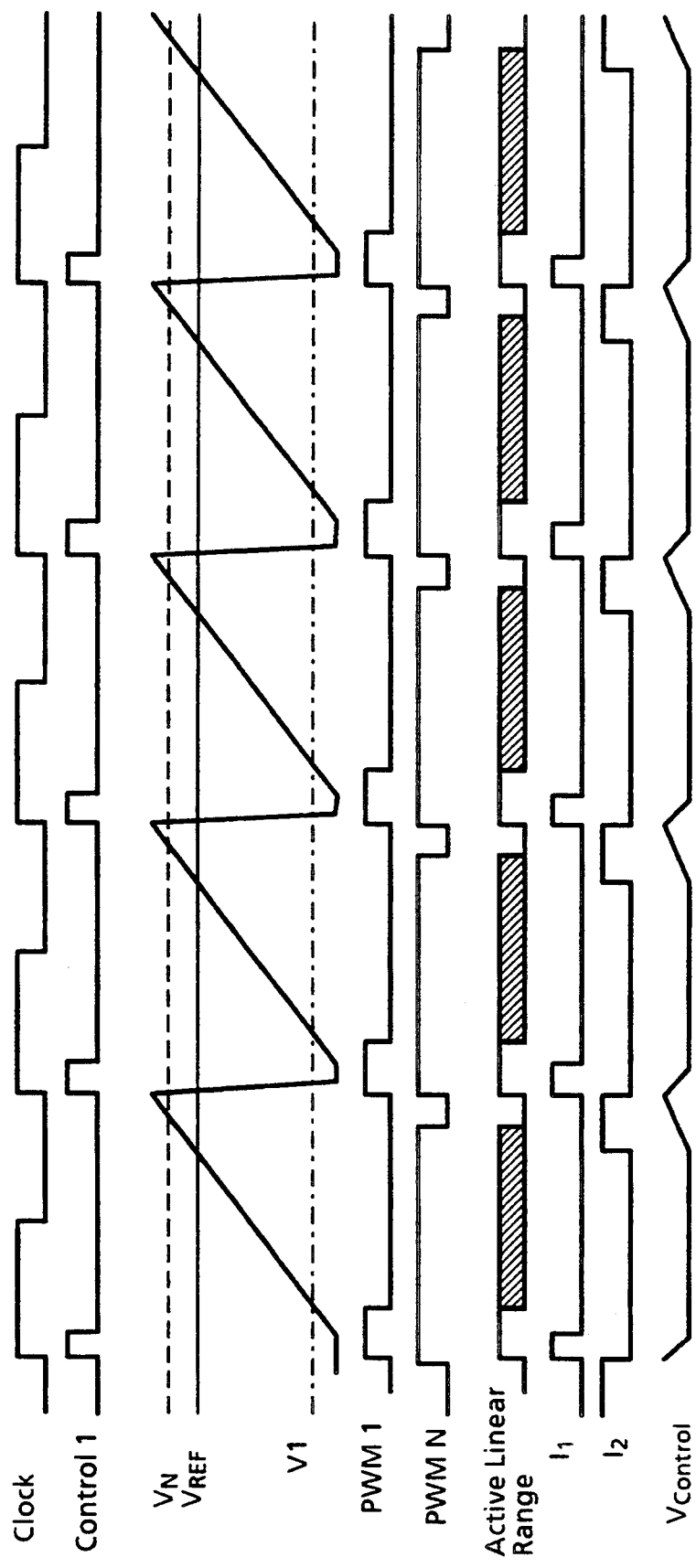
FIG. 2 is a detailed timing diagram of this invention.

The detailed waveshapes of this invention are shown in FIG. 2. From the top, the Clock period is measured from one positive going wave front to the next. Each Clock is used to create a short Control 1 signal that starts at clock time and lasts long enough to bring the ramp waveshape down to zero. Next, the ramp is shown with respect to three dc levels. VN is the highest reference level that can be produced, which results in the longest pulse output. V1 is the lowest reference level that can be produced, which results in the shortest pulse output. VREF is a DC level within the circuit that controls the ramp rise time.

PWM 1 is the short output pulse shape if V1 is used. PWM N is the long output pulse shape if VN is used. The time between the longest and shortest pulse lengths is the active linear range of the circuit, and is shown as the cross hatched section of the next waveshape. The remaining waveshapes of FIG. 2 will be discussed with relation to FIGS. 3, 4 and 5.

Figure 3:
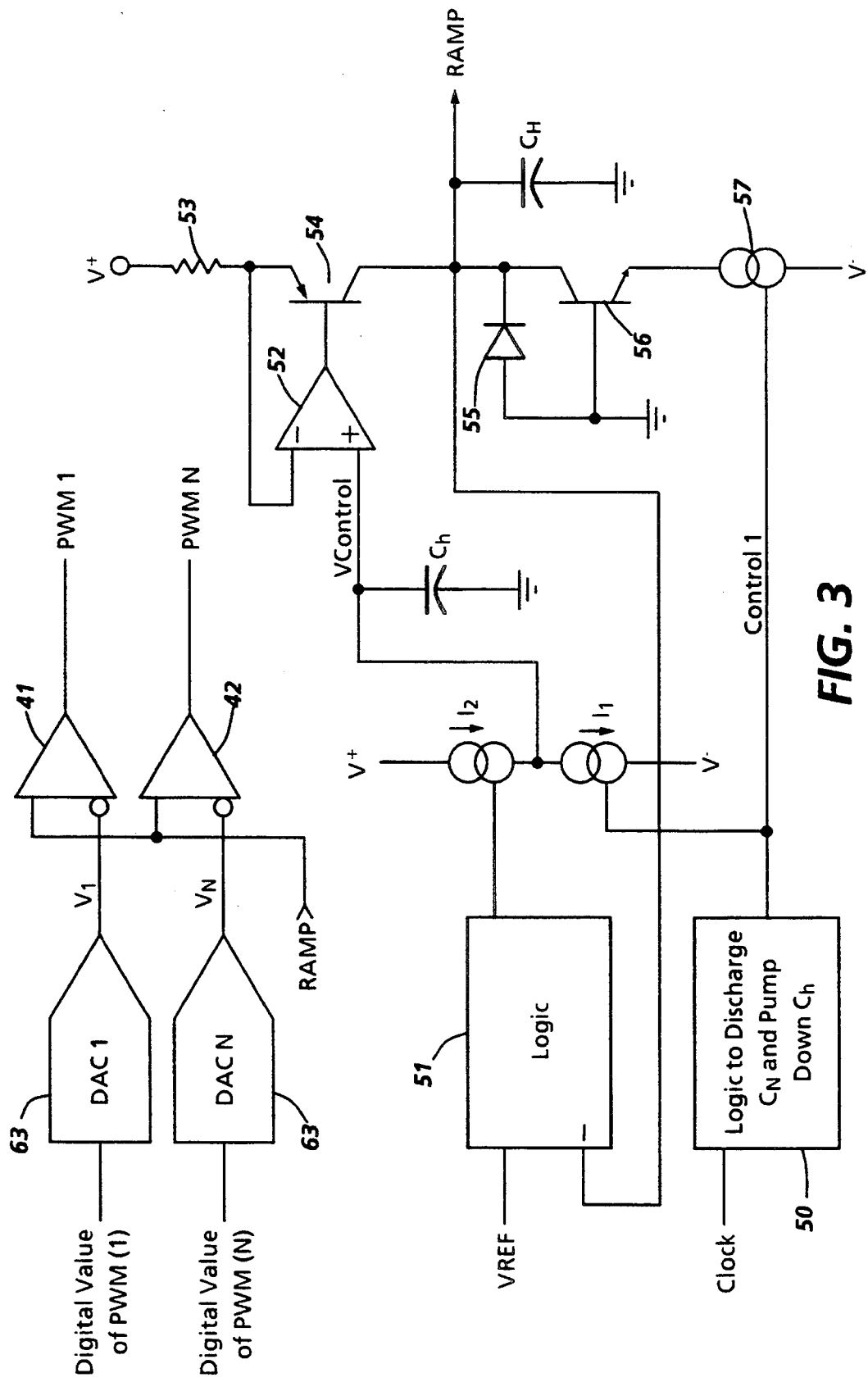
FIG. 3 is a block diagram of the circuit.

Assuming that a ramp has been generated, two different sets of output pulses can be generated in parallel as shown in FIG. 3. Digital values of PWM 1 and PWM N are applied to two DACs 63, the outputs being two voltage levels, V1 and VN. These levels are compared to the ramp by comparators 41, 42, the outputs of which are the two digital output PWM signals, PWM 1 and PWM N.

The ramp is generated in the remainder of the circuit. First the Clock is input to the Logic 50 which generates the fixed Control 1 signal. This signal is coupled to the current generator 57 which turns on for the duration of the positive portion of the Control 1 signal to discharge CH, through transistor 56 and diode 55, to zero at the beginning of each cycle. Control 1 also turns on current generator I1 at the same time to discharge Capacitor Ch by a small predetermined amount (not to zero). At the end of the Control 1 signal, the residual positive charge on capacitor Ch is coupled to the + input of operational amplifier 52, transistor 54 and resistor 53, all of which constitute a current generator which charges up capacitor CH to create a ramp. When this ramp is equal to the VREF level, the Logic block 51 will output a signal to current generator 12 to charge up capacitor Ch at a predetermined rate. This will continue until the start of the next clock pulse The outcome of this entire process is that the slope of the ramp is a function of the clock frequency, the longer the clock period, the longer the ramp will become to maintain the output duty cycle in spite of a change in clock frequency. This can be explained as follows.

The slope of the ramp is set by the dc level on capacitor Ch. This capacitor is charged down by the I1 current generator which is ON for a fixed amount of time, namely the duration of the Control 1 signal. On the other hand it is charged up by the amount of time that the ramp is above the VREF level, which can vary. If the ramp slope is too steep, the ramp will reach the VREF level too soon, the I2 signal will become longer, more time will be spent by the I2 current generator charging up capacitor CH, the general level of V Control will rise, and the amount of current through transistor 54 will decrease, charging up capacitor CH at a slower rate. By the same reasoning, if the slope is not steep enough, the charge current to CH will rise to increase it. Finally, if the clock frequency is not changing and the slope is already correct, the amount Ch is charged by I2 will exactly equal the amount Ch is discharged by I1, and the ramp slope will remain constant. The final result is, as the clock period varies, the slope will also vary to keep the duty cycle constant in spite of a changing clock frequency.

Figure 4:
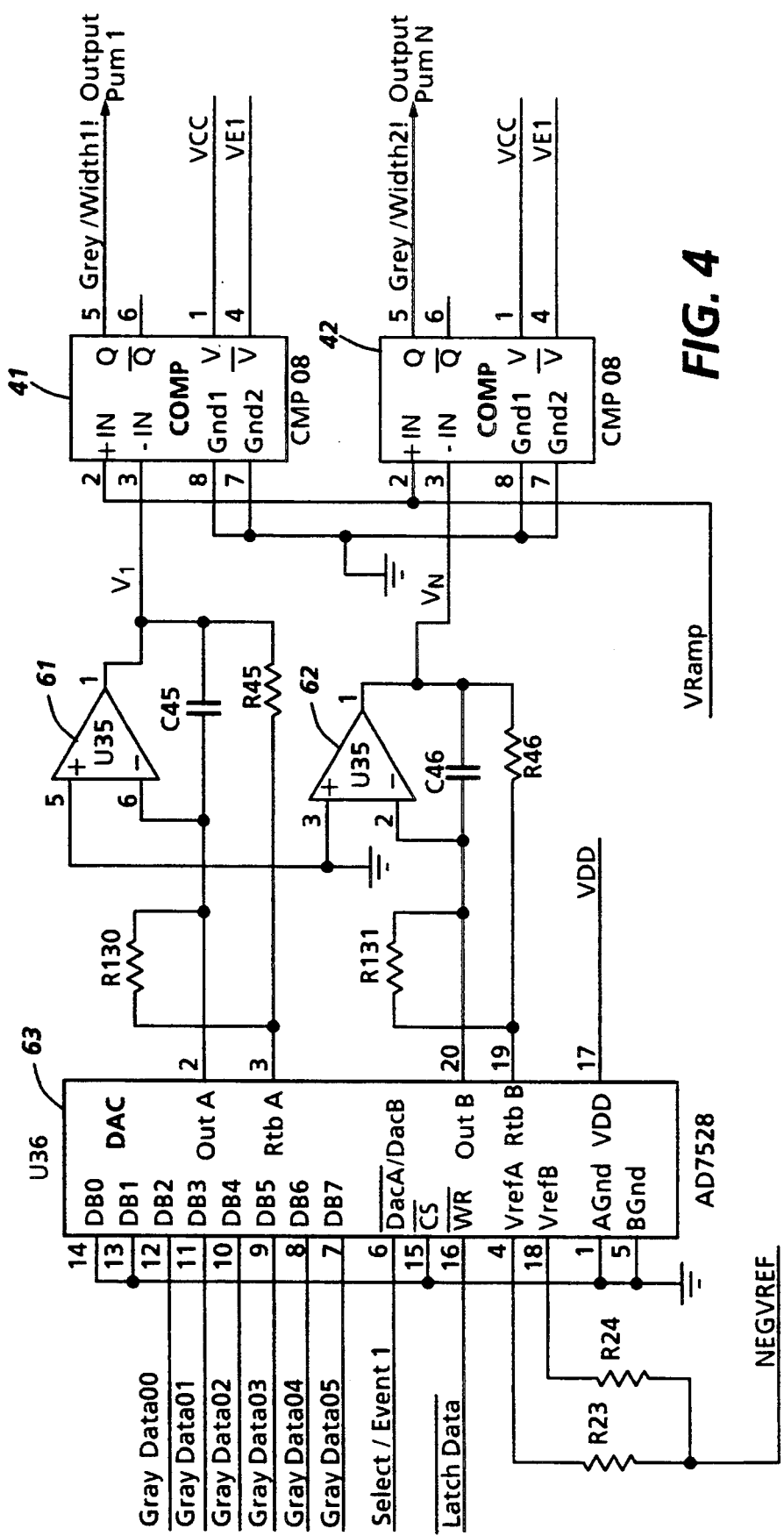
FIGS. 4 and 5 are detailed schematics of the circuit.
Figure 5:
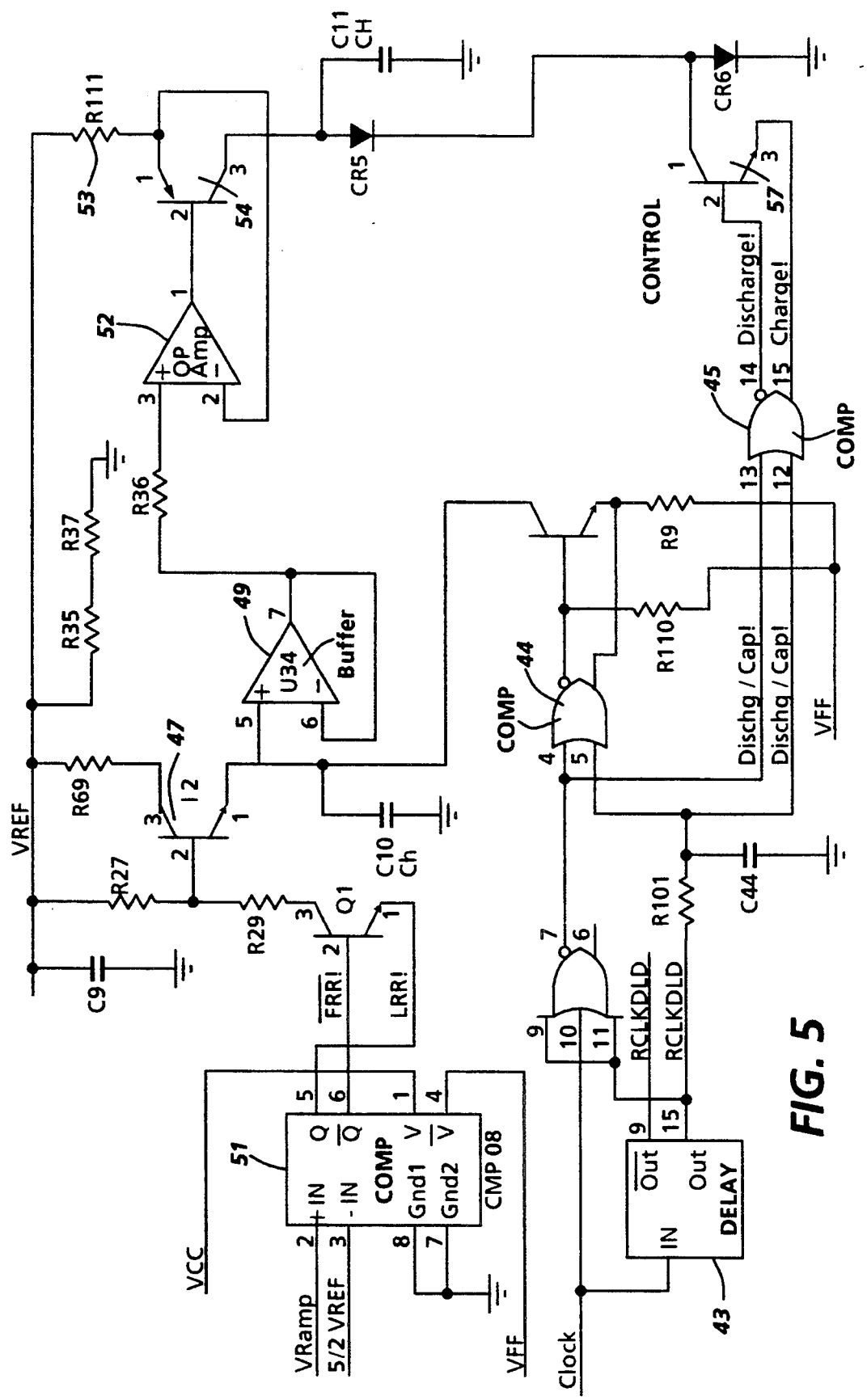

FIGS. 4 and 5 show an alternate embodiment which is shown as detailed schematics. This embodiment can use the same ramp to create two sets of output pulses. In FIG. 4, two digital PWM values are applied to two DACs 63 in one package. The two analog output voltages buffered through two amplifiers 61 62 and the ramp signal VRAMP are applied to two comparators 41, 42 to generate the two output signals, PWM 1 and PWM N.

FIG. 5 shows the ramp generator. The clock is input to a delay line 43 and two comparators 44, 45 which generate two fixed pulse signals, equivalent to the Control 1 signal of FIG. 4. One of these is applied to current generator 46 which bleeds a fixed amount of charge off capacitor Ch. The other is applied through transistor 57 to the ramp capacitor CH, discharging it completely.

At the end of the Control 1 pulse, the residual charge on capacitor Ch is felt through buffer 49 and op amp 52, turning on transistor 54 to charge up the ramp capacitor CH. If the circuit is operating properly, this will ultimately result in a time when the ramp voltage exceeds the VREF voltage, at which time the comparator 51 will turn on the I2 current generator transistor 47 which charges up capacitor Ch to the same extent that I1 current generator transistor 46 discharged it at the beginning of the cycle. However, if the slope had been too shallow, the time that the ramp is above the VREF level would be short, the charge time would be shorter, and the charge remaining would be less that it was before. This would ultimately result in an increase in the ramp slope. Similarly, the closed loop would operate decrease the slope if it was too steep.

It can now be seen that this circuit has several unique characteristics. First, there is at least a minimum amount of overdrive since the ramp does not stop until a minimum time after the maximum length pulse is output. Second, the discharge time, which is the duration of the Control 1 signal, is fixed. Third, a feedback loop is provided to guarantee that the duty cycle will be constant for a varying clock frequency. Fourth, because the ramp is not terminated at the time of the pulse output, several pulse widths can be produced in parallel, and finally, the circuit is small and simple.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

The invention claimed is:

1. A pulse width modulation pulse generator comprising:

A clock generator for generating a series of clock pulses, threshold means for generating a threshold voltage of any value between a low voltage and a high voltage within a voltage range, ramp means responsive to said series of clock pulses for generating a ramp having a slope, amplitude and duration, said ramp amplitude exceeding said high voltage in said range by a predetermined amount, said ramp duration being an amount less than the time between the rising edges of said clock pulses, a comparator for producing an output of one state immediately before the crossover of said ramp and threshold voltage, and for producing an output of the other state for the remainder of the time between the rising edges of said clock pulses, and means responsive to the time between clock pulses for increasing or decreasing the slope of said ramp as the time between the rising edges of said clock pulses decreases or increases, respectively, to maintain a constant output pulse duty cycle as the time between the rising edges of said clock pulses varies.

* * * * *